(12) United States Patent
Uematsu (10) Patent No.: US 7,447,059 B2
(45) Date of Patent: Nov. 4, 2008

(54) SEMICONDUCTOR INTEGRATED CIRCUIT

(75) Inventor: Satoru Uematsu, Minehara Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/424,587

(22) Filed: Jun. 16, 2006

(65) Prior Publication Data

US 2006/0291274 A1    Dec. 28, 2006

(30) Foreign Application Priority Data

Jun. 28, 2005    (JP)    ............... 2005-187729

(51) Int. Cl.
*G11C 11/00* (2006.01)
(52) U.S. Cl. ...................................... 365/154
(58) Field of Classification Search ............... 365/63, 365/185.07, 230.05
See application file for complete search history.

(56) References Cited

U.S. PATENT DOCUMENTS

| | | | | |
|---|---|---|---|---|
| 4,922,459 | A | * | 5/1990 | Hidaka ................ 365/206 |
| 5,500,814 | A | * | 3/1996 | Kinoshita et al. ......... 365/49 |
| 2004/0218455 | A1 | * | 11/2004 | Nii ................ 365/230.05 |
| 2005/0047256 | A1 | * | 3/2005 | Yang ............... 365/230.05 |
| 2005/0253267 | A1 | * | 11/2005 | Takao .................. 257/758 |

FOREIGN PATENT DOCUMENTS

| | | |
|---|---|---|
| JP | 10-222983 | 8/1998 |
| JP | 2003-078036 | 3/2003 |
| JP | 2003-085976 | 3/2003 |

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A semiconductor integrated circuit having an internal SRAM that includes a plurality of arrayed memory cells, including a first bit line and a second bit line that are connected to first ports and a third bit line and a fourth bit line that are connected to second ports of the memory cells, a first and second transistor respectively compose first ports of adjacent first and second memory cells and having shared impurity diffusion region connected to the first bit line via a first interconnection, a third transistor composing a second port of the first memory cell and having an impurity diffusion region connected to the third bit line via a second interconnection a fourth and fifth transistor respectively composing the first ports of the first and second memory ceils and having a shared impurity diffusion region connected to the second bit line via a third interconnection.

12 Claims, 7 Drawing Sheets

SEMICONDUCTOR INTEGRATED CIRCUIT

The entire disclosure of Japanese Patent Application No. 2005-187729, filed Jun. 28, 2005 is expressly incorporated by reference herein.

BACKGROUND OF THE INVENTION

1. Technical Field

The present invention relates to a semiconductor integrated circuit with an internal dual-port static random access memory (SRAM) in which two ports, provided for each memory cell in the SRAM, can be respectively switched between writing data and reading data and used.

2. Related Art

A multi-port SRAM that can simultaneously read-write access a plurality of addresses is known as one type of SRAM. The multi-port SRAM described in JP-A-10-222983, an example of related art, includes a plurality of memory cells from which data can be read and to which data can be written; a read bit line pair that is placed in parallel on both sides of the memory cells in an array direction; a write bit line pair that is placed in parallel outside of the read bit line pair; a read word line for memory cell selection provided in correspondence with the read bit line pair; and a write word line for memory cell selection provided in correspondence with the write line pair.

In the multi-port SRAM, the two bit lines composing the read bit line pair have an intersecting region in the middle. Thus, coupling noise due to the influence of coupling capacitance present between the read bit line pair and the write bit line pair is cancelled. This is advantageous in that error can be prevented when writing and reading simultaneously. At the same time, in accompaniment with the intersecting of the two bit lines, a write inverting circuit that inverts in advance the value of data to be written to a specified memory cell and a read inverting circuit that inverts in advance the value of data read from a specified memory cell must be newly added.

Figure 7:
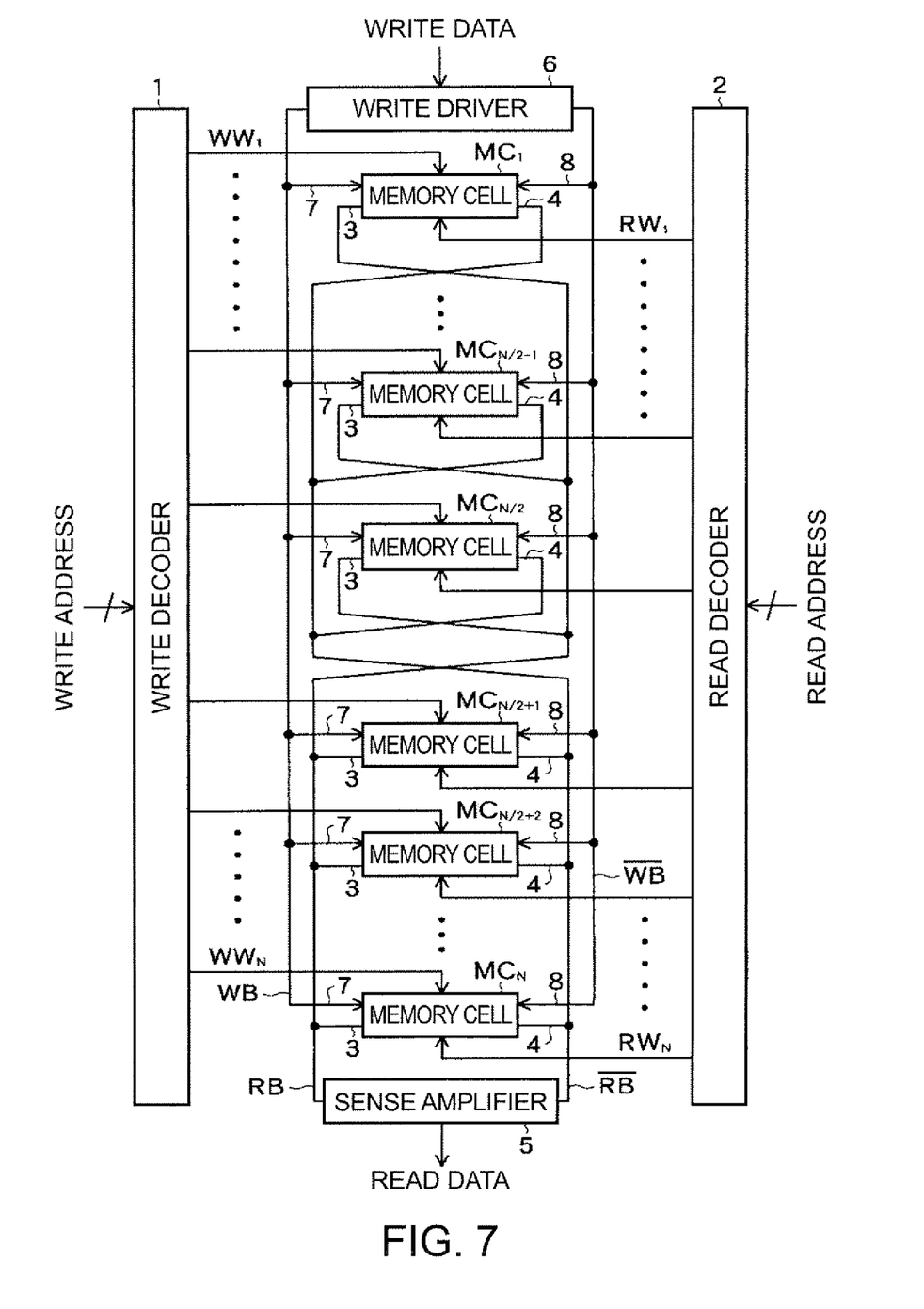
FIG. 7 is a block diagram showing a configuration of a multi-port SRAM described in JP-A-2003-78036.

Therefore, in JP-A-2003-78036, another example of related art, a multi-port SRAM that can quickly and stably output data read from a memory cell without the addition of a new circuit is described. FIG. 7 is a block diagram of a configuration of the multi-port SRAM described in JP-A-2003-78036.

The multi-port SRAM shown in FIG. 7 includes: a write decoder 1 to which a write address is applied; a read decoder 2 to which a read address is applied; N number of memory cells $MC_1$ to $MC_N$ that are arrayed in a row at predetermined intervals between the write decoder 1 and the read decoder 2; a sense amplifier 5 that reads data from a memory cell specified by the read address and outputs the data as read data; and a write driver 6 to which write data is applied that writes data to a memory cell specified by the write address.

The write decoder 1 decodes the applied write address and activates only one word line among an N number of write word lines $WW_1$ to $WW_N$. The read decoder 2 decodes the applied read address and activates only one word line among an N number of read word lines $RW_1$ to $RW_N$.

The memory cells $MC_1$ to $MC_N$ are respectively connected to the write word lines $WW_1$ to $WW_N$ that correspond with the output of the write decoder 1 and are also respectively connected to the read word lines $RW_1$ to $RW_N$ that correspond with the output of the read decoder 1. Two complementary read bit lines RB and /RB for reading data from each memory cell are placed in parallel on both sides of the memory cells $MC_1$ to $MC_N$ in the array direction, thus forming a read bit line pair.

The read bit lines RB and /RB forming the read bit line pair intersect almost in the center of the region in which the memory cells $MC_1$ to $MC_N$ are arrayed. Each memory cell and the read bit line RB are connected via a connecting wire 3. Each memory cell and the read bit line /RB are connected via a connecting wire 4. The connecting wires 3 and the connecting wires 4 of the memory cells $MC_1$ to $MC_{N/2}$, which are the upper half of the N number of memory cells $MC_1$ to $MC_N$, intersect.

The read bit lines RB and /RB are connected to a sense amplifier 5. The sense amplifier 5 amplifies a differential signal outputted from a memory cell specified by the read address and outputs a logic-level signal (read data).

Two complementary write bit lines WB and /WB for writing data to the memory cells $MC_1$ to $MC_N$ are placed in parallel on both sides of the read bit lines RB and /RB, thus forming a write bit line pair. Each memory cell and the write bit line WB are connected via a connecting wire 7. Each memory cell and the write bit line /WB are connected via a connecting wire 8.

The write bit lines WB and /WB are connected to a write driver 6. The write driver 6 writes data to a memory cell specified by the write address by outputting a differential signal to the memory cell based on the write data.

In this way, the read bit lines RB and /RB intersect halfway and are switched left and right, and in correspondence, the connecting wires 3 and the connecting wires 4 intersect. Thus, data read from a memory cell can be output quickly and stably without the addition of a new circuit.

However, in the multi-port SRAM, the capacities placed on the bit lines are generally unbalanced between the write bit line pair composing a first port and the read bit line pair composing a second port. This is not a problem when one port is used exclusively for writing and the other port is used exclusively for reading. However, when this configuration is applied to a dual-port SRAM in which each port is respectively switched between writing data and reading data and used, this a problem in that the operating speeds between the two ports differ.

JP-A-10-222983 (page 1 and FIG. 1) and JP-A-2003-78036 (pages 3, 5 to 6, and FIG. 1) are examples of related art.

SUMMARY

An advantage of the present invention is to provide a semiconductor integrated circuit with an internal dual-port static random access memory (SRAM) in which two ports, provided for each memory cell in the SRAM, can be respectively switched between writing data and reading data and used, and in which imbalance in characteristics between the two ports are improved.

A semiconductor integrated circuit according to one aspect of the invention has an internal SRAM that includes at least one row in which a plurality of memory cells are arrayed, the semiconductor integrated circuit including: a first bit line and a second bit line that are connected to first ports of the memory cells; a third bit line and a fourth bit line that are connected to second ports of the memory cells; a first transistor and a second transistor respectively composing first ports of adjacent first and second memory cells and having a common impurity diffusion region connected to the first bit line via a first interconnection; a third transistor composing a second port of the first memory cell and having an impurity diffusion region connected to the third bit line via a second interconnection; a fourth transistor and a fifth transistor respectively composing the first ports of the first and second memory cells and having a common impurity diffusion region connected to the second bit line via a third interconnection; a sixth transistor composing a second port of the first memory cell and having an impurity diffusion region connected to a fourth bit line via a fourth interconnection; a first write/read circuit that writes data to and reads data from the memory cells via the first port; and a second write/read circuit that writes data to and reads data from the memory cells via the second port; in which the lengths of the second and fourth interconnection are shorter than the lengths of the first and third interconnection.

The impurity diffusion region of the third transistor can be connected to the third bit line formed directly above the impurity diffusion region, and the impurity diffusion region of the sixth transistor can be connected to the fourth bit line formed directly above the impurity diffusion region. In addition, the second write/read circuit can be placed closer to the memory cells than the first write/read circuit.

Furthermore, the memory cells can include a first group of consecutively arrayed memory cells and a second group of consecutively arrayed memory cells, and the first bit line and the second bit line can be sterically intersected between the first group of memory cells and the second group of memory cells.

According to an aspect of the invention, the imbalance between the characteristics of the two ports can be improved if the length of the second interconnection and the fourth interconnection respectively connected to the impurity diffusion regions of the third transistor and the sixth transistor, to which relatively large capacities are placed, is formed shorter than the lengths of the first interconnection and the third interconnection respectively connected to the impurity diffusion regions of the first and second transistors and the fourth and fifth transistors, to which relatively small capacities are placed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described.

Figure 1:
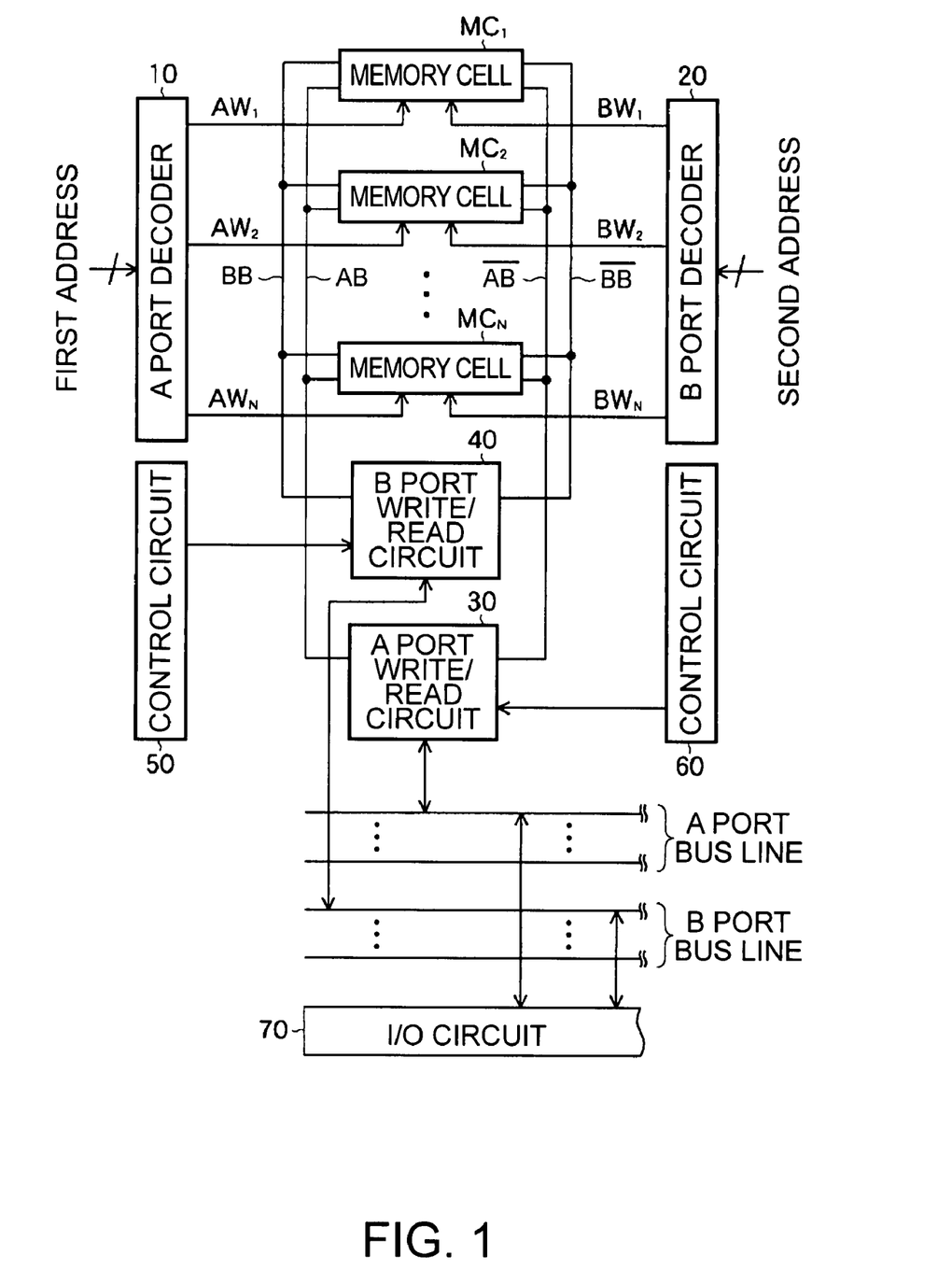
FIG. 1 is a block diagram showing a dual-port SRAM in a first embodiment of the present invention.

FIG. 1 is a block diagram showing a configuration of a dual-port SRAM embedded in a semiconductor integrated circuit according to a first embodiment of the invention. The dual-port SRAM includes a memory cell array composed of a plurality of SRAM cells arrayed in a matrix. In FIG. 1, N number of memory cells $MC_1$ to $MC_N$ in a first row are is shown.

The dual-port SRAM shown in FIG. 1 includes: an A port decoder 10 to which a first address is applied; a B port decoder 20 to which a second address is applied; an N number of memory cells $MC_1$ to $MC_N$ arrayed in a row at a predetermined interval between the A port decoder 10 and the B port decoder 20; an A port write/read circuit 30 that writes data to or reads data from a memory cell specified by the first address via an A port; a B port write/read circuit 40 that writes data to or reads data from a memory cell specified by the second address via a B port; a control circuit 50 that controls the A port write/read circuit 30; a control circuit 60 that controls the B port write/read circuit 40; and an I/O circuit 70 that inputs and outputs write data and read data to and from an external circuit.

The A port decoder 10 decodes the applied first address and only activates a word line corresponding to the first address among an N number of A port word lines $AW_1$ to $AW_N$. The B port decoder 20 decodes the applied second address and only activates a word line corresponding to the second address among an N number of B port word lines $BW_1$ to $BW_N$.

The memory cells $MC_1$ to $MC_N$ are respectively connected to the corresponding word lines $AW_1$ to $AW_N$ at the output-end of the A port decoder 10 and are also respectively connected to the corresponding word lines $BW_1$ to $BW_N$ at the output-end of the B port decoder 20. Bit lines AB and /AB composing an A port bit line pair and bit lines BB and /BB composing a B port bit line pair are placed in parallel on both sides of the memory cells memory cells $MC_1$ to $MC_N$. The bit lines are connected to each memory cell, $MC_1$ to $MC_N$.

The bit lines AB and /AB composing the A port bit line pair are connected to the A port write/read circuit 30. The A port write/read circuit 30, controlled by the control circuit 50, writes data to the memory cell specified by the first address, amplifies a differential signal output from the memory cell specified by the first address, and outputs a logic-level signal (read data).

The bit lines BB and /BB composing the B port bit line pair are connected to the B port write/read circuit 40. The B port write/read circuit 40, controlled by the control circuit 60, writes data to the memory cell specified by the second address, amplifies a differential signal output from the memory cell specified by the second address, and outputs a logic-level signal (read data)

The A port write/read circuit 30 is connected to the I/O circuit 70 via an A port bus line. The B port write/read circuit 40 is connected to the I/O circuit 70 via a B port bus line. The I/O circuit 70 outputs write data inputted from an external circuit to the A port write/read circuit 30 or the B port write/read circuit 40 and outputs the read data inputted from the A port write/read circuit 30 or the B port write/read circuit 40 to an external circuit.

Figure 2:
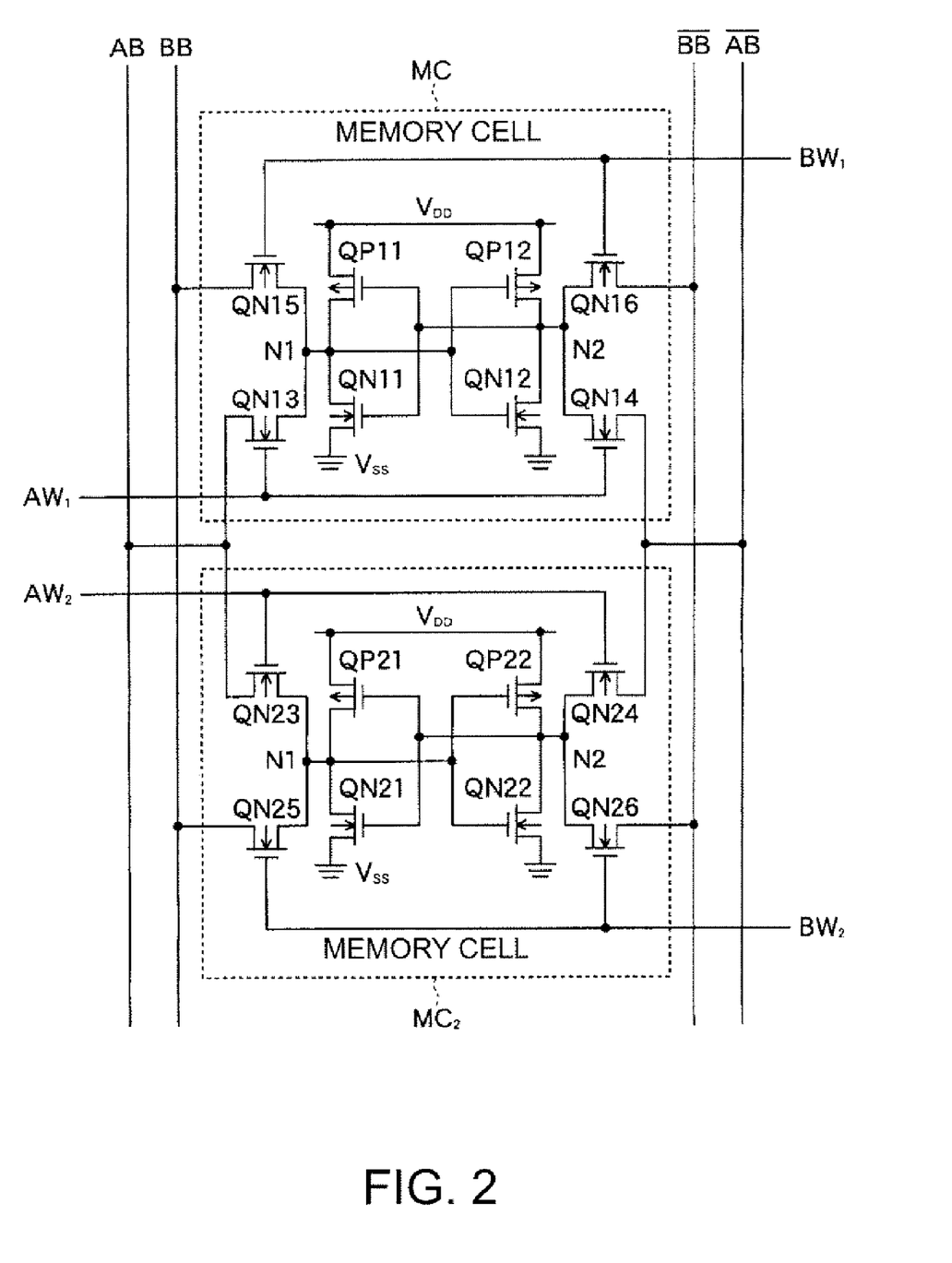
FIG. 2 is a circuit diagram showing memory cells included in the dual-port SRAM shown in FIG. 1.

FIG. 2 is a circuit diagram showing a configuration of the memory cells included in the dual-port SRAM shown in FIG. 1. In FIG. 2, only two memory cells, $MC_1$ and $MC_2$, are shown. The memory cell $MC_1$ includes: a P-channel metal-oxide semiconductor (MOS) transistor QP11 and an N-channel MOS transistor QN11 that compose a first inverter; a P-channel MOS transistor QP12 and an N-channel MOS transistor QN12 that compose a second inverter; and N-channel MOS transistors QN 13 to QN 16 that operate as transmission gates. The output of the first inverter is connected to a first store node N1 and the input is connected to a second store node N2. The output of the second inverter is connected to the second store node N2 and the input is connected to the first store node N1.

A source and drain path of the transistor QN13 is connected between the bit line AB and the first store node N1. The source and drain path of the transistor QN14 is connected between the bit line /AB and the second store node N2. The gates of the transistor QN13 and the transistor QN14 are connected to the word line $AW_1$.

A source and drain path of the transistor QN15 is connected between the bit line BB and the first store node N1. A source and drain path of the transistor QN16 is connected between the bit line /BB and the second store node N2. The gates of the transistor QN15 and the transistor QN16 are connected to the word line $BW_1$. In the memory cell $MC_1$, the transistors QN13 and QN 14 compose the A port and the transistors QN15 and QN16 compose the B port.

Similarly, the memory cell $MC_2$ includes: a P-channel MOS transistor QP21 and an N-channel MOS transistor QN21 that compose a first inverter; a P-channel MOS transistor QP22 and a N-channel MOS transistor QN22 that compose a second inverter; and N-channel MOS transistors QN 23 to QN 26 that operate as transmission gates. In the memory cell $MC_2$, the transistors QN23 and QN 24 compose the A port and the transistors QN25 and QN26 compose the B port.

The source or drain of the transistor QN13 included in the memory cell $MC_1$ (the source or drain connected to the bit line AB) and the source or drain of the transistor QN23 included in the memory cell $MC_2$ (the source or drain connected to the bit line AB) are composed using a common impurity diffusion region, and thus, the source or drain capacity placed on one transistor is almost halved. In other words, with regards to junction capacity, the capacity placed on the A port bit line is smaller than the capacity placed on the B port bit lines. To simplify explanations, hereinafter, the source or drain connected to the bit line within the impurity diffusion region of the MOS transistor will be referred to as the source and the source or drain connected to the store node will be referred to as the drain.

An operation in which data is written in the memory cells will be explained with reference to FIG. 2.

When writing data in the memory cell $MC_1$ via the A port, the A port decoder 10 provides a high level signal to the word line $AW_1$ and the A port write/read circuit 30 provides, for example, a high level signal to the bit line AB and a low level signal to the bit line /AB. The transistors QN13 and QN14 are turned on by the high level signal applied to the word line $AW_1$, the store node N1 becomes the same high level as the bit line AB, and the store node N2 becomes the same low level as the bit line /AB. One bit of data is stored in the memory cell $MC_1$ by the first and second inverters maintaining this state.

Next, an operation in which data is read from the memory cells will be explained.

When reading data from the memory cell $MC_1$ via the A port, the A port decoder 10 provides a high level signal to the word line $AW_1$ and the transistors QN13 and QN14 are turned on. As a result, the bit line AB becomes the same level as the store node N1 and the bit line /AB becomes the same level as the store node N2. One bit of data stored in the memory cell $MC_1$ is read by the A port write/read circuit 30 performing differential amplification of the levels of the bit line AB and the bit line /AB.

Figure 3:
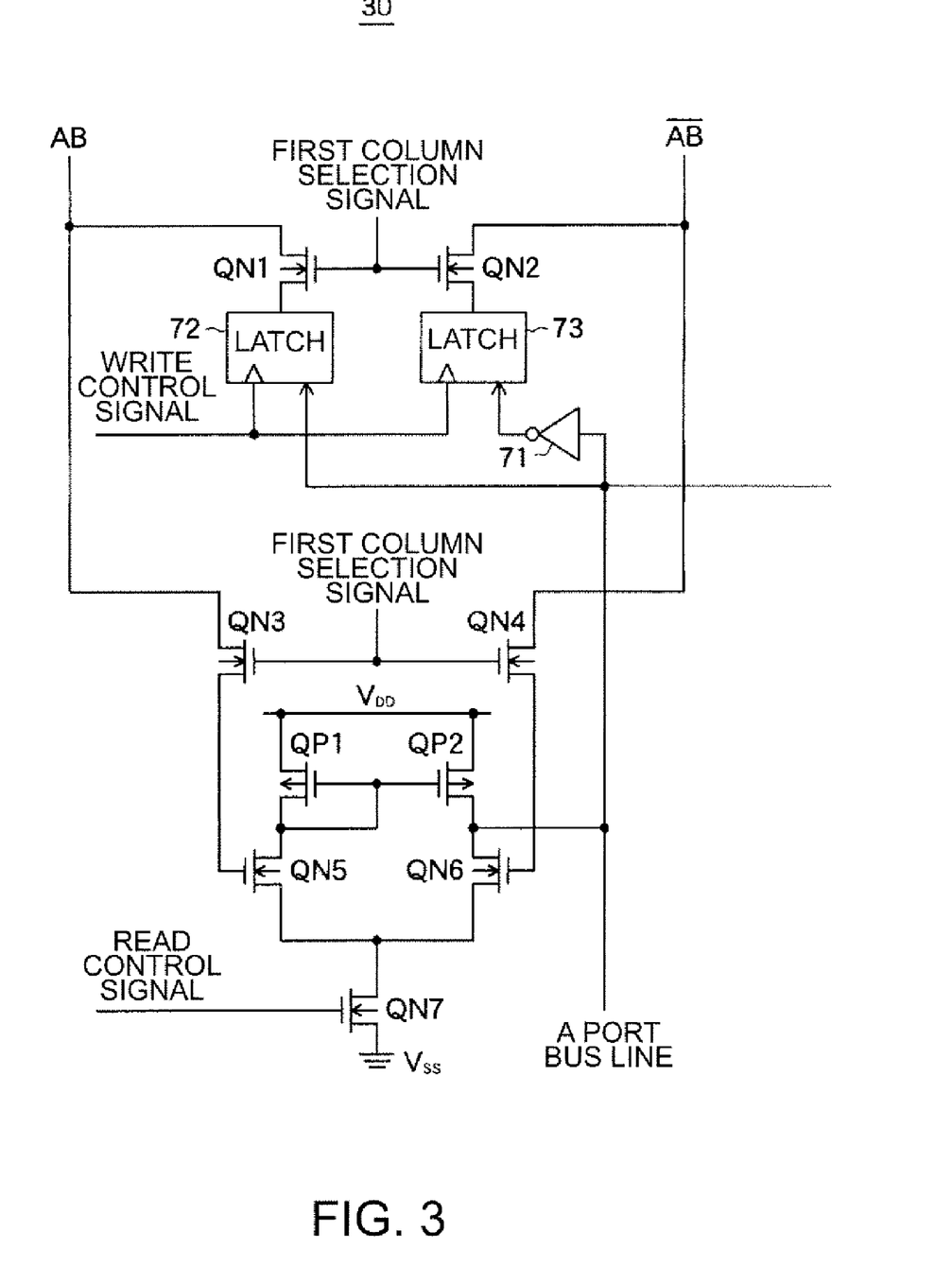
FIG. 3 is a circuit diagram showing a configuration of an A port write/read circuit shown in FIG. 1.

FIG. 3 is a circuit diagram showing a configuration of the A port write/read circuit included in the dual-port SRAM shown in FIG. 1. As shown in FIG. 3, the A port write/read circuit 30 includes: N-channel MOS transistors QN1 and QN2 that are turned on when a first column selection signal is activated to high level; an inverter 71 that inverts write data applied from the A port bus line; a latch circuit 72 that latches write data in synchronization with a write control signal and provides the latched data to the bit line AB; and a latch circuit 73 that latches inverted write data in synchronization with the write control signal and outputs the latched data to the bit line /AB.

The A port write/read circuit 30 further includes: N-channel MOS transistors QN3 and QN4 that are turned on when the first column selection signal is activated to high level; and a differential amplifier (sense amplifier) composed of the P-channel MOS transistors QP1 and QP2 and the N-channel MOS transistors QN5 to QN7. The sense amplifier operates when a read control signal is activated to a high level, generates read data by performing differential amplification on the levels of the bit line AB and the bit line /AB, and outputs the generated read data to the A port bus line. The configuration of the B port write/read circuit 40 is the same as that of the A port write/read circuit 30.

Next, a layout of the dual-port SRAM shown in FIG. 1 will be explained.

Figure 4:
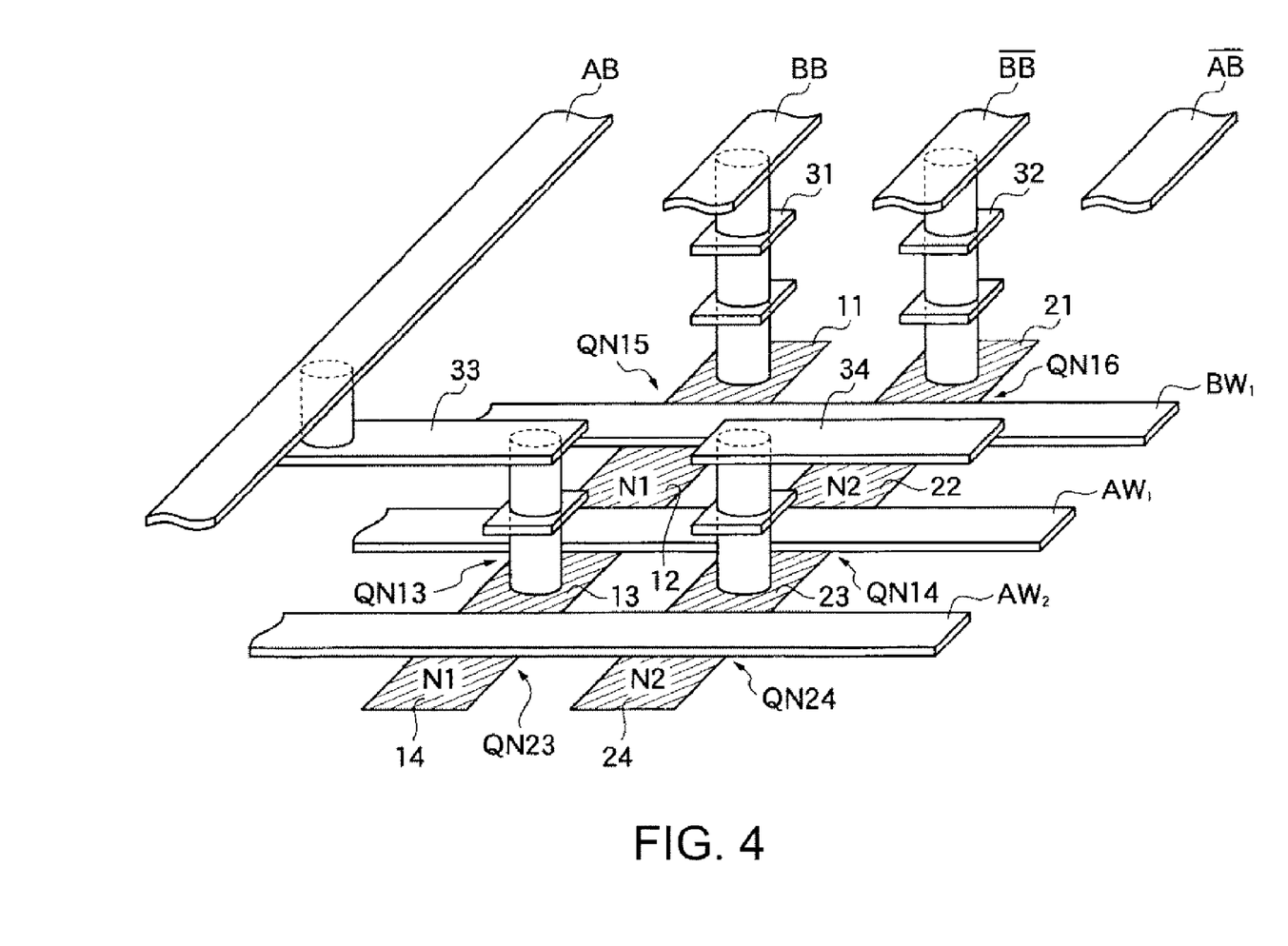
FIG. 4 is a diagram showing a layout of the dual-port SRAM shown in FIG. 1.

FIG. 4 is a diagram showing a layout of a portion of the constituent elements included in the dual-port SRAM shown in FIG. 1. In FIG. 4, insulating films are omitted to clarity the interconnections of each component.

A plurality of gate electrodes, which are word lines $BW_1$, $AW_1$, and $AW_2$, is formed on a semiconductor substrate via a gate insulating film. N-type impurity diffusion regions 11 to 14 and 21 to 24 are formed within the semiconductor substrate on both sides of the gate electrodes. A three-layer interconnection layer is further formed on the semiconductor substrate via an interlayer insulating film. Interconnections 31 to 34 are formed in the second layer of the interconnection layer. A port bit lines AB and /AB and B port bit lines BB and /BB are formed in the third layer of the interconnection layer.

The impurity diffusion region 12 is equivalent to a shared drain of the transistors QN15 and QN 13 shown in FIG. 2 and is electrically connected to the store node N1 of the memory cell $MC_1$. The impurity diffusion region 14 is equivalent to the shared drain of the transistors QN23 and QN 25 and is electrically connected to the store node N1 of the memory cell $MC_2$. The impurity diffusion region 11 is equivalent to the source of the transistor QN 15 and is electrically connected to the bit line BB via the interconnection 31. The impurity diffusion region 13 is equivalent to the shared source of the transistors QN13 and QN23 and is electrically connected to the bit line AB via the interconnection 33.

Similarly, the impurity diffusion region 22 is equivalent to the shared drain of the transistors QN16 and QN 14 shown in FIG. 2 and is electrically connected to the store node N2 of the memory cell $MC_1$. The impurity diffusion region 24 is equivalent to the shared drain of the transistors QN 24 and QN 26 and is electrically connected to the store node N2 of the memory cell $MC_2$. The impurity diffusion region 21 is equivalent to the source of the transistor QN 16 and is electrically connected to the bit line BB via the interconnection 32. The impurity diffusion region 23 is equivalent to the shared source of the transistors QN 14 and QN 24 and is electrically connected to the bit line /AB via the interconnection 34.

The sources of the transistors QN 13 and QN23 electrically connected to the A port bit line AB are shared, whereas the source of the transistor QN 15 electrically connected to the B port bit line BB is independent. Thus, respective source capacities of the transistors QN13 and QN23 are about half of the source capacity of the transistor QN15.

Furthermore, the sources of the transistors QN 14 and QN 24 electrically connected to the A port bit line /AB are shared, whereas the source of the transistor QN16 electrically connected to the B port bit line /BB is independent. Thus, the respective source capacities of the transistors QN14 and QN24 are about half of the source capacity of the transistor QN16. Therefore, with regards to the junction capacity, the capacity placed on the A port bit line is smaller than the capacity placed on the B port bit line, as explained earlier.

In accordance with the present embodiment, the interconnection connected between the B port bit line BB and the source of the transistor QN15 and the interconnection connected between the B port bit line BB and the source of the transistor QN16 are shortened by the B port bit lines BB and /BB being placed inside (preferably directly above the sources of the transistors QN15 and QN16). As a result, the wiring capacities placed on the bit lines BB and /BB are reduced.

The A port bit lines AB and /AB are placed outside, and thus, the wiring capacities placed on the bit lines AB and /AB increase with the difference between the interconnections 31 and 32 and the interconnections 33 and 34 in the third layer of the interconnection layer. The wiring capacities are equivalent to about 15% of the total capacity placed on the bit lines.

Furthermore, in accordance with the present embodiment, the wiring capacities of the B port bit lines BB and /BB are reduced by the B port write/read circuit 40 being placed closer to the memory cells than the A port write/read circuit 30. Therefore, the difference in junction capacities can be compensated to a certain extent by the difference in wiring capacities.

The amount of improvement in the bit line capacity balance according to the first embodiment was determined by simulation. A semiconductor integrated circuit in which the source of a transistor with a small junction capacity is connected to an inner bit line is assumed as a comparative example. Femtofarad (fF) is used as the capacity unit.

Comparative Example

Bit line AB capacity: 378 fF

Bit line BB capacity: 559 fF

First Embodiment

Bit line AB capacity: 401 fF

Bit line BB capacity: 461 fF

The specifications of the dual-port SRAM are determined by the port with the poorer characteristics, and thus, it is preferable that the bit line capacities of the two ports are balanced. The ratio of the bit line capacities of the two ports in the comparative example is 1.48. However, the ratio of the bit line capacities of the two ports according to the first embodiment is 1.15, and thus, it is clear that the imbalance between the capacities of the two ports have been improved.

Next, a second embodiment of the invention will be explained.

Figure 5:
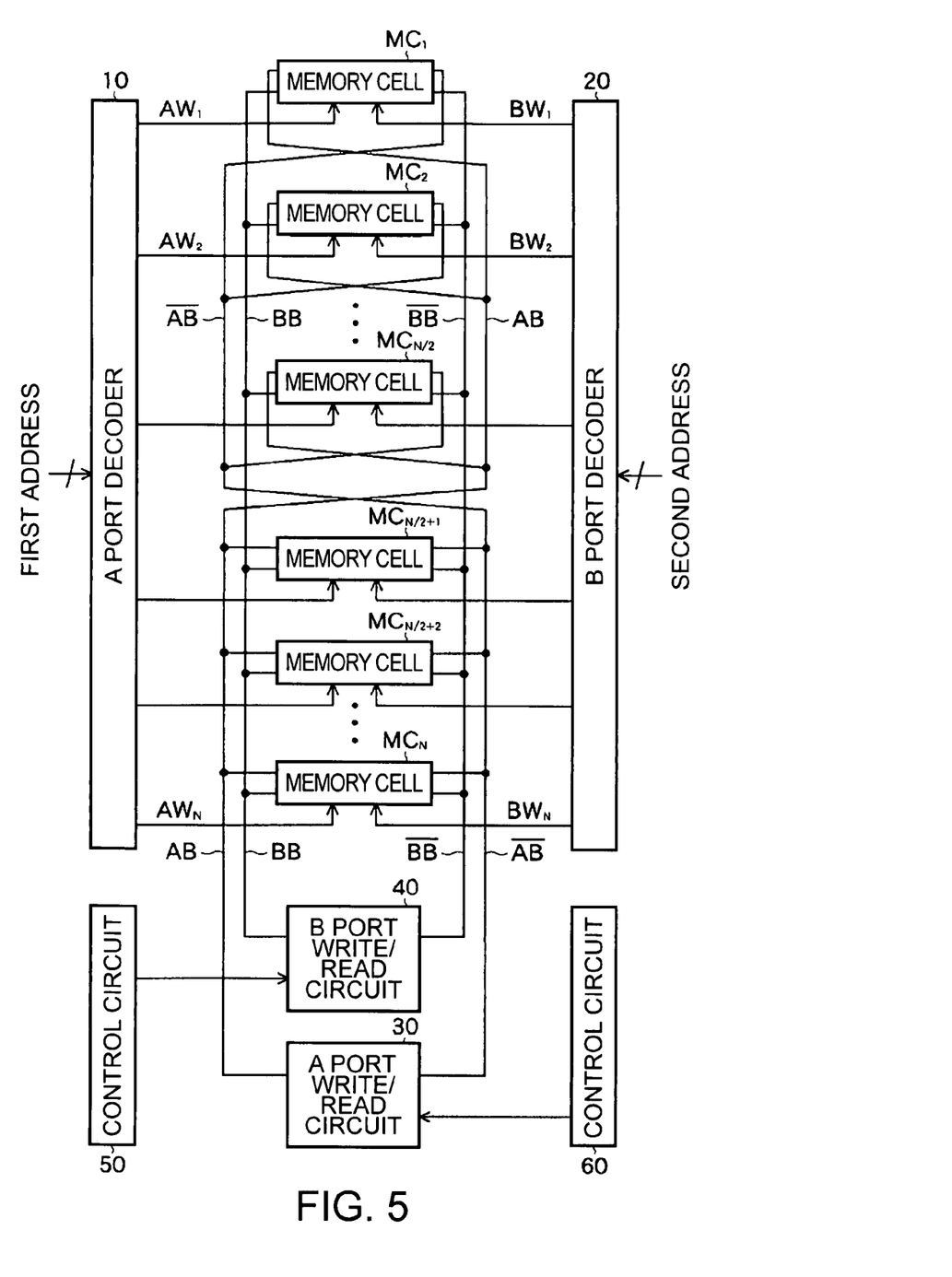
FIG. 5 is a block diagram showing a dual-port S in a second embodiment of the present invention.

FIG. 5 is a block diagram showing a partial configuration of the dual port S1 embedded in the semiconductor integrated circuit according to the second embodiment of the invention. The dual-port SRAM differs from the dual-port SRAM according to the first embodiment, shown in FIG. 1, in layout only, and is the same as that in the first embodiment in other respects.

According to the second embodiment, the A port bit lines AB and /AB intersect between any one row of memory cells (preferably almost in the center). As a result, cross-talk noise between the A port and the B port can be reduced. FIG. 5 shows N number of memory cells $MC_1$ to $MC_N$ in a first row. Here, N is an even number, and the bit lines AB and /AB sterically intersect between the N/2 memory cell $MC_{N/2}$ and the (N/2+1) memory cell $MC_{N/2+1}$.

In addition, with regards to the memory cells $MC_1$ to $MC_{N/2}$, two interconnections connecting each memory cell and the bit lines AB and /AB intersect. As a result, there is no need to provide a write inverting circuit that inverts in advance the value of data to be written in the memory cells $MC_1$ to $MC_{N/2}$ and a read inverting circuit that inverts in advance the value of data read from the memory cells $MC_1$ to $MC_{N/2}$.

Next, a layout of the dual-port SRAM shown in FIG. 5 will be explained.

Figure 6:
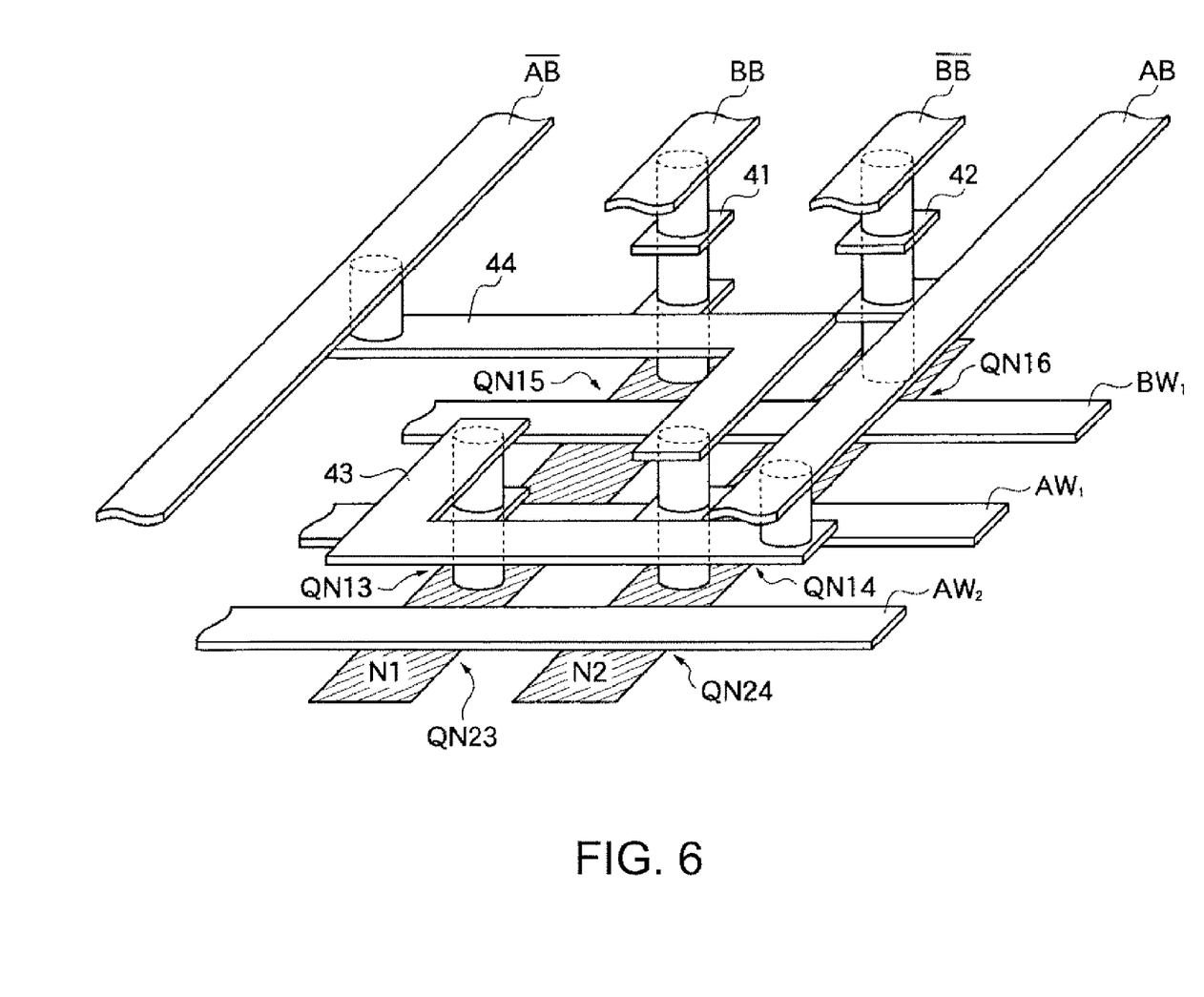
FIG. 6 is a diagram showing a layout of the dual-port SRAM shown in FIG. 5.

FIG. 6 is a diagram showing a layout of a portion of the constituent elements included in the dual-port DRAM shown in FIG. 5. In FIG. 6, insulating films are omitted to clarify the interconnections of each component.

A plurality of gate electrodes, which are word lines $BW_1$, $AW_1$, and $AW_2$, is formed on a semiconductor substrate via a gate insulating film. A plurality of N-type impurity diffusion regions are formed within the semiconductor substrate on both sides of the gate electrodes. A three-layer interconnection layer is further formed on the semiconductor substrate via an interlayer insulating film. Interconnections 41 to 44 are formed in the second layer of the interconnection layer. A port bit lines AB and /AB and B port bit lines BB and /BB are formed in the third layer of the interconnection layer. The bit lines AB and /AB intersect, and thus, the placement of the bit lines AB and /AB are opposite of that shown in FIG. 4.

The shared source of the transistors QN 13 and QN 23 shown in FIG. 2 is electrically connected to the bit line AB via the interconnection 43. The shared source of the transistors QN14 and QN 24 is electrically connected to the bit line /AB via the interconnection 44. The source of the transistor QN15 is electrically connected to the bit line BB via the interconnection 41. The source of the transistor QN16 is electrically connected to the bit line BB via the interconnection 42.

The sources of the transistors QN13 and QN23 electrically connected to the A port bit line AB are shared, whereas the source of the transistor electrically connected to the B port bit line BB is independent. Thus, the source capacity of the transistor QN13 is about half of the source capacity of the transistor QN15.

Furthermore, the sources of the transistors QN 14 and QN 24 electrically connected to the A port bit line /AB are shared, whereas the source of the transistor QN16 electrically connected to the B port bit line /BB is independent. Thus, the respective source capacities of the transistors QN14 and QN24 are about half of the source capacity of the transistor QN16. Therefore, with regards to the junction capacity, the capacity placed on the A port bit line is smaller than the capacity placed on the B port bit line, as explained earlier.

In accordance with the present embodiment, the interconnection connected between the B port bit line BB and the source of the transistor QN15 and the interconnection connected between the B port bit line BB and the source of the transistor QN16 are shortened by the B port bit lines BB and /BB being placed inside (preferably directly above the sources of the transistors QN15 and QN16). As a result, the wiring capacities placed on the bit lines BB and /BB are reduced.

The A port bit lines AB and /AB are placed outside, and thus, the wiring capacities placed on the bit lines AB and /AB increase with the difference between the interconnections 41 and 42 and the interconnections 43 and 44 in the third layer of the interconnection layer.

Furthermore, in accordance with the present embodiment, the wiring capacities of the B port bit lines BB and /BB are reduced by the B port write/read circuit 40 being placed closer to the memory cells than the A port write/read circuit 30. Therefore, the difference in junction capacities can be compensated to a certain extent by the difference in wiring capacities.

The amount of improvement in the bit line capacity balance according to the second embodiment was determined by simulation. A semiconductor integrated circuit in which the source of a transistor with a small junction capacity is connected to an inner bit line is assumed as a comparative example.

Comparative Example

Bit line AB capacity: 399 fF

Bit line BB capacity: 559 fF

Second Embodiment

Bit line AB capacity: 433 fF

Bit line BB capacity: 461 fF

The specifications of the dual-port SRAM are determined by the port with the poorer characteristics, and thus, it is preferable that the bit line capacities of the two ports are balanced. The ratio of the bit line capacities of the two ports in the comparison example is 1.40. However, the ratio of the bit line capacities of the two ports according to the first embodiment is 1.06, and thus, it is clear that the imbalance between the capacities of the two ports is improved.

Designing of a semiconductor integrated circuit that has an internal dual-port SRAM is facilitated by the reduced difference in the characteristics between the two ports, and thus, designing period can be shortened. Furthermore, the operation timings of the two ports become closer due to the improvement in the imbalance in the timing at which the sense amplifier is turned on and the like, which determine the characteristics of data reading. As a result, changes in the characteristics due to process fluctuation, etc., can be reduced and the semiconductor integrated circuit will not be easily influenced by manufacturing variations.

What is claimed is:

1. A semiconductor integrated circuit having an internal SRAM that includes at least one row in which a plurality of memory cells are arrayed, the semiconductor integrated circuit comprising:

a first bit line and a second bit line that are connected to first ports of the memory cells;

a third bit line and a fourth bit line that are connected to second ports of the memory cells;

a first transistor and a second transistor respectively composing first ports of adjacent first and second memory cells and having a shared impurity diffusion region connected to the first bit line via a first interconnection;

a third transistor composing a second port of the first memory cell and having an impurity diffusion region connected to the third bit line via a second interconnection;

a fourth transistor and a fifth transistor respectively composing the first ports of the first and second memory cells and having a shared impurity diffusion region connected to the second bit line via a third interconnection;

a sixth transistor composing a second port of the first memory cell and having an impurity diffusion region connected to the fourth bit line via a fourth interconnection;

a first write/read circuit that writes data to and reads data from the memory cells via the first port; and a second write/read circuit that writes data to and reads data from the memory cells via the second, wherein the lengths of the second and fourth interconnections are shorter than the lengths of the first and third interconnections, wherein the first, second, third, and fourth interconnections include a first conductive layer, a first wiring layer, a second conductive layer, and a second wiring layer, and wherein the second and fourth interconnections include a third conductive layer.

2. The semiconductor integrated circuit according to claim 1, wherein the impurity diffusion region of the third transistor is connected to the third bit line formed directly above the impurity diffusion region, and the impurity diffusion region of the sixth transistor is connected to the fourth bit line formed directly above the impurity diffusion region.

3. The semiconductor integrated circuit according to claim 1, wherein the second write/read circuit is placed closer the memory cells than the first write/read circuit.

4. The semiconductor integrated circuit according to claim 1, wherein the memory cells include a first group of consecutively arrayed memory cells and a second group of consecutively arrayed memory cells, and the first bit line and the second bit line sterically intersect between the first group of memory cells and the second group of memory cells.

5. A semiconductor integrated circuit comprising:

a first memory cell including a first port, a second port, a first inverter, and a second inverter, the first port including a first transistor and a second transistor,the second port including a third transistor and a fourth transistor;

a second memory cell including a third port, a fourth port, a third inverter,and a fourth inverter, the third port including a fifth transistor and a sixth transistor, thefourth port including a seventh transistor and an eighth transistor;

a first bit line connected to the first port and the third port;

a second bit line connected to the first port and the third port;

a third bit line connected to the second port and the fourth port;

a fourth bit line connected to the second port and the fourth port;

a first circuit that writes data to and reads data from the first memory cell via the first port and/or the second memory cell via the third port; and a second circuit that writes data to and reads data from the first memory cell via the second port and/or the second memory cell via the fourth port, the first transistor and the fifth transistor having a first common impurity region connected to the first bit line via a first interconnection, the first interconnection including a first conductive layer, a first wiring layer, a second conductive layer, and a second wiring layer, the second transistor and the sixth transistor having a second common common impurity region connected to the second bit line via a second interconnection, the second interconnection including the first conductive layer, the first wiring layer,the second conductive layer, and the second wiring layer, the third transistor having a first impurity region connected to the third bit line via a third interconnection, the third interconnection including the first conductive layer, the first wiring layer, the second conductive layer, the second wiring layer, and a third conductive layer, the fourth transistor having a second impurity region connected to the fourth bit line via a fourth interconnection, the fourth interconnection including the first conductive layer, the first wiring layer, the second conductive layer, the second wiring layer, and the third conductive layer, and a length of the second wiring layer of the third interconnection and a length of the second wiring layer of the fourth interconnection being shorter than a length of the second wiring layer of the first interconnection.

6. The semiconductor integrated circuit according to claim 5, comprising:

a plurality of memory cells including the first memory cell and the second memory cell;

the second circuit being placed closer to the plurality of memory cells than the first circuit is.

7. The semiconductor integrated circuit according to claim 6, wherein:

the plurality of memory cells includes a first group of consecutively arrayed memory cells and a second group of consecutively arrayed memory cells, and the first bit line and the second bit line sterically intersect between the first group of consecutively arrayed memory cells.

8. A semiconductor integrated circuit comprising:

a memory cell including a first port, a second port, a first inverter, and a second inverter, the first port including a first transistor and a second transistor, the second port including a third transistor and a fourth transistor;

a first bit line connected to the first port;

a second bit line connected to the first port;

a third bit line connected to the second port;

a fourth bit line connected to the second port;

a first circuit that writes data to and reads data from the memory cell via the first port;

a second circuit that writes data to and reads data from the memory cell via the second port;

the first bit line and an impurity diffusion region of the first transistor being connected via a first contact structure, the first contact structure including a first conductive layer, a first wiring layer, a second conductive layer, and a second wiring layer.

9. An integrated circuit comprising:

a plurality of static random access memory (SRAM) cells that each have first and second ports, wherein each of the first ports includes first and second transistors and each of the second ports includes third and fourth transistors;

a first bit line and a second bit line that are connected to first ports of the SRAM cells;

a third bit line and a fourth bit line that are connected to second ports of the SRAM cells;

a first write/read circuit that writes data to and reads data from the SRAM cells via the first and second bit lines; and a second write/read circuit that writes data to and reads data from the SRAM cells via the third and fourth bit lines, wherein the first transistor of one of the SRAM cells and the first transistor of an adjacent one of the SRAM cells share a common impurity diffusion region that is connected to the first bit line via a first interconnection, wherein the second transistor of the one of the SRAM cells and the second transistor of the adjacent one of the SRAM cells share a common impurity diffusion region that is connected to the second bit line via a second interconnection, wherein the third transistor of the one of the SRAM cells is connected to the third bit line via a third interconnection, wherein the fourth transistor of the one of the SRAM cells is connected to the fourth bit line via a fourth interconnection, and wherein the third and fourth interconnections are shorter than the first and second interconnections.

10. The integrated circuit of claim 9:

wherein the third transistor of the adjacent one of the SRAM cells is connected to the third bit line via a fifth interconnection, wherein the fourth transistor of the adjacent one of the SRAM cells is connected to the fourth bit line via a sixth interconnection, and wherein the fifth and sixth interconnections are shorter than the first and second interconnections.

11. The integrated circuit of claim 9 wherein the first write/read circuit is located closer to the SRAM cells than the second write/read circuit is.

12. The integrated circuit of claim 9 wherein the SRAM cells comprise a first contiguous group of SRAM cells and a second contiguous group of SRAM cells, and wherein the first and second bit lines intersect between the first and second contiguous groups of SRAM cells.

* * * * *